(12) United States Patent
Chinthu et al.

(10) Patent No.: US 12,740,097 B2
(45) Date of Patent: Sep. 15, 2026

(54) STRUCTURE WITH ISOLATED WELL

(71) Applicant: GlobalFoundries U.S. Inc., Malta, NY (US)

(72) Inventors: Siva Kumar Chinthu, Bangalore (IN); Venkatesh P. Gopinath, Fremont, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 810 days.

(21) Appl. No.: 18/104,341

(22) Filed: Feb. 1, 2023

(65) Prior Publication Data

US 2024/0258320 A1 Aug. 1, 2024

(51) Int. Cl.

| | |
|---|---|
| ***H10D 30/67*** | (2025.01) |
| ***H10D 30/63*** | (2025.01) |
| ***H10D 86/00*** | (2025.01) |
| ***H10D 86/01*** | (2026.01) |
| ***H10W 10/17*** | (2026.01) |
| ***H10W 10/30*** | (2026.01) |

(52) U.S. Cl.

CPC ....... *H10D 30/6704* (2025.01); *H10D 30/637* (2025.01); *H10D 86/01* (2025.01); *H10D 86/201* (2025.01); *H10W 10/17* (2026.01); *H10W 10/30* (2026.01)

(58) Field of Classification Search

CPC ... H10D 30/6704–6708; H10W 10/30; H10W 10/17

See application file for complete search history.

(56) References Cited

U.S. PATENT DOCUMENTS

| | | | | |
|---|---|---|---|---|
| 7,259,428 | B2 * | 8/2007 | Inaba | H10D 84/038 257/353 |
| 9,601,511 | B2 | 3/2017 | Vinet et al. | |
| 9,710,006 | B2 | 7/2017 | Boling | |
| 2012/0194263 | A1 | 8/2012 | Lin et al. | |
| 2020/0152661 | A1 * | 5/2020 | Tipple | H10D 86/201 |

OTHER PUBLICATIONS

Fang-Ping Chou et al., “Effect of Deep N-Well Bias in an 850-nm Si Photodiode Fabricated Using the CMOS Process”, in IEEE Photonics Technology Letters, vol. 25, No. 7, pp. 659-662, Apr. 1, 2013, doi: 10.1109/LPT.2013.2248352, 4 pages.

Jiong-Guang Su et al., “Improving the RF performance of 0.18 μm CMOS with deep n-well implantation”, in IEEE Electron Device Letters, vol. 22, No. 10, pp. 481-483, Oct. 2001, doi: 10.1109/55.954918, Abstract, 3 pages.

(Continued)

*Primary Examiner* — Daniel Luke

(74) *Attorney, Agent, or Firm* — Daivd Cain; Andrew M. Calderon; Calderon Safran & Wright P.C.

(57) ABSTRACT

The present disclosure relates to semiconductor structures and, more particularly, to a structure with an isolated well and methods of manufacture. The structure includes: a floating well of a first dopant type within a semiconductor substrate; a second well of a second dopant type within the floating well of the first dopant type; a reverse bias diode at a junction between the floating well and the semiconductor substrate; and a forward bias diode at a junction between the floating well and the second well.

17 Claims, 2 Drawing Sheets

(56) References Cited

OTHER PUBLICATIONS

Abdellatif Bellaouar et al., "Millimeter-Wave Circuit Design and Techniques in FDSOI CMOS Technology", in The 2018 IEEE MTT-S, International Microwave Symposium, https://2018.ims-ieee.org/, Jun. 2018, Philadelphia, PA, 52 pages.

L. Grenouillet et al., "UTBB FDSOI transistors with dual STI for a multi-Vt strategy at 20nm node and below", 2012 International Electron Devices Meeting, San Francisco, CA, USA, 2012, pp. 3.6.1-3.6.4, doi: 10.1109/IEDM.2012.6478974, Abstract, 2 pages.

* cited by examiner

STRUCTURE WITH ISOLATED WELL

BACKGROUND

The present disclosure relates to semiconductor structures and, more particularly, to a structure with an isolated well and methods of manufacture.

In integrated circuit (IC) devices, or some circuits within an IC device, bodies of transistors have a permanent connection to a power supply voltage. For example, bodies of p-channel MOS transistors are connected to a high power supply voltage (e.g., VDD), while bodies of n-channel transistors are connected to a low power supply voltage (e.g., VSS).

The bodies of transistors can be biased to a potential that is different from a power supply voltage. Such body biasing can alter the performance of the transistors. For example, a greater reverse body bias (i.e., p-channels body biased to a voltage above VDD or n-channel body biased to a voltage less than VSS) can decrease a transistor current leakage; whereas a greater forward body bias (i.e., p-channels body biased to a voltage below VDD or n-channel body biased to a voltage above VSS) can increase transistor switching speed. In fully depleted semiconductor on insulator (FDSOI) transistors, a deep N-well may be biased with an existing parasitic well diode. This results in leakage issues, though. To correct this issue, a contact and metal may connect the deep N-well to provide a fixed bias such that the deep N-well and p-well can be held at a positive potential. This requires additional masks and adds to fabrication costs.

SUMMARY

In an aspect of the disclosure, a structure comprises: a floating well of a first dopant type within a semiconductor substrate; a second well of a second dopant type within the floating well of the first dopant type; a reverse bias diode at a junction between the floating well and the semiconductor substrate; and a forward bias diode at a junction between the floating well and the second well.

In an aspect of the disclosure, a structure comprises: a semiconductor substrate comprising a floating well of a first dopant type and a well of an opposite dopant type to the first dopant type; a buried insulator layer above the semiconductor substrate; a semiconductor on insulator material above the insulator buried layer, the semiconductor on insulator material comprising diffusion regions; a gate structure on the semiconductor on insulator material between the diffusion regions; and a bias contact connecting to the well.

In an aspect of the disclosure, a method comprises: forming a floating well of a first dopant type within a semiconductor substrate; and forming a second well of a second dopant type within the floating well of the first dopant type, wherein a first diode is formed at a junction between the floating well and the semiconductor substrate, and a second diode is formed at a junction between the floating well and the second well.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a structure with an isolated well and methods of manufacture. More specifically, the structure of the present disclosure comprises an isolated P-well using a deep N-well with a diode isolation. Advantageously, the present disclosure provides a solution of creating an isolated P-well from a layout with a previously grounded p-type substrate. The present disclosure also improves design fix time and provides reduced manufacturing costs due to a reduced mask count. Moreover, the device fix may be used to bias a deep n-well with existing well parasitic diodes, without additional tap connections, with reduced area and with a reduced mask set to save fabrication cost during silicon bug fix.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
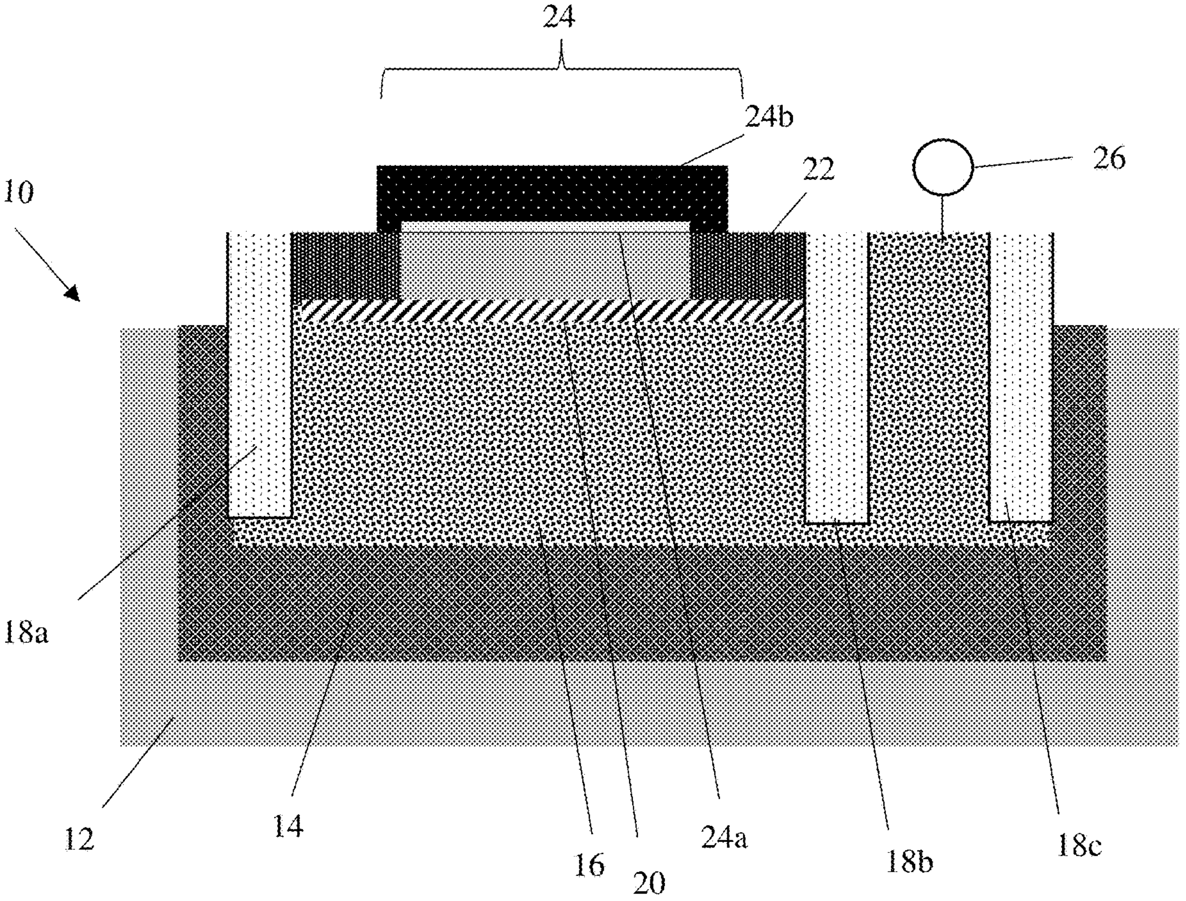
FIG. 1 shows a device with an isolated well and respective fabrication processes in accordance with aspects of the present disclosure.

FIG. 1 shows a structure and respective fabrication processes in accordance with aspects of the present disclosure. In embodiments, the structure 10 of FIG. 1 may be representative of a PFET device. The structure 10 includes a semiconductor substrate 12 which may be any appropriate semiconductor material. For example, the semiconductor substrate 12 may be composed of any suitable material including, but not limited to, Si, SiGe, SiGeC, SiC, GaAs, InAs, InP, and other III/V or II/VI compound semiconductors. The semiconductor substrate 12 may preferably be a p-type handle substrate used in semiconductor on insulator (SOI) technology.

A deep N-well 14 may be provided in the semiconductor substrate 12. In embodiments, the deep N-well 14 may be a floating N-well formed by ion implantation processes using an n-type dopant. The deep N-well 14 is devoid of any taps or contacts. A P-well 16 may be formed in the deep N-well 14 by an ion implantation process using a p-type dopant. In embodiments, the P-well 16 may be isolated using the N-well 14 (and deep trench isolation structures 18).

A reverse bias diode may form at a junction of the deep N-well 14 and the semiconductor substrate 12; whereas a forward bias diode may form at a junction of the deep N-well 14 and the P-well 16. In embodiments, the reverse bias diode and the forward bias diode form a back-to-back diode configuration. As should be understood by those of skill in the art, the reverse bias diode will prevent a DC current path from the P-well 16 to the semiconductor substrate 12. On the other hand, the forward bias diode will provide a current path to the deep N-well 14 in order to bias the deep N-well 14. Also, in embodiments, the reverse bias diode and the forward bias diode may electrically isolate the deep N-well 14 and the P-well 16.

In forming the deep N-well 14 and the P-well 16, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The deep N-well 14 is doped with n-type dopants, e.g., Arsenic (As), Phosphorus (P) and Antimony (Sb), among other suitable examples. A P-well 16 may be formed in the deep N-well 14 and may comprise p-type dopant (e.g., Boron (B)).

Still referring to FIG. 1, a plurality of deep trench isolation structures 18*a*, 18*b*, 18*c* may be formed in the P-well 16. In embodiments, the deep trench isolation structures 18*a*, 18*c* may be provided at edges of the P-well 16 at a junction of the P-well 16 and the deep N-well 14, and the deep trench isolation structure 18*b* may be formed within the body of the P-well 16.

The deep trench isolation structures 18*a*, 18*b*, 18*c* can be formed by conventional lithography, etching and deposition methods known to those of skill in the art. For example, a resist formed over the P-well 16 is exposed to energy (light) and developed utilizing a conventional resist developer to form a pattern (opening). An etching process with a selective chemistry, e.g., reactive ion etching (RIE), will be used to transfer the pattern to the P-well 16 (e.g., semiconductor substrate 12) to form one or more trenches through the openings of the resist. Following the resist removal by a conventional oxygen ashing process or other known stripants, the insulator material, e.g., $SiO_2$, can be deposited by any conventional deposition processes, e.g., chemical vapor deposition (CVD) processes. Any residual material on the surface of the semiconductor substrate 12 can be removed by conventional chemical mechanical polishing (CMP) processes.

A buried insulator layer 20 may be formed over the P-well 16 and between two of the deep trench isolation structures 18*a*, 18*b*. In embodiments, the buried insulator layer 20 may be any suitable material, including silicon oxide, sapphire, other suitable insulating materials, and/or combinations thereof. An exemplary insulator layer may be a buried oxide layer (BOX). The buried insulator layer 20 may be formed by any suitable process, such as separation by implantation of oxygen (SIMOX), thermal oxidation, deposition, and/or wafer bonding.

A semiconductor material 22 may be formed over the buried insulator layer 20. In embodiments, the semiconductor material 22 may be a top semiconductor layer used in SOI technology. For example, the semiconductor material 22 may be fully depleted semiconductor on insulator (FD-SOI) material comprising, for example, Si, Ge, SiGe, SiC, SiGeC, a III-V compound semiconductor, a II-VI compound semiconductor or any combinations thereof. In embodiments, the semiconductor material 22 may be doped with a P+ dopant in order to form diffusion regions, e.g., source and drain region of a gate structure 24. The handle substrate 12 provides mechanical support to the buried insulator layer 20 and the top semiconductor layer 22.

The gate structure 24 may include a gate dielectric material 24*a* and a gate electrode material 24*b*. In embodiments, the gate dielectric material 24*a* may be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate electrode material 24*b* may be a polysilicon material or a replacement gate metal, e.g., Ti, TiAlC, Al, TiAl, TaN, TIN, TiC and C. In embodiments, the gate dielectric material 24*a* and gate electrode material 24*b* may be formed by conventional deposition methods, e.g., CVD, and patterning processes as is known in the art such that no further explanation is required herein for a complete understanding of the present disclosure. The deep trench isolation structures 18*a*, 18*b* will provide electrical isolation to the gate structure 24.

FIG. 1 further shows a P-well bias contact 26 between the deep trench isolation structures 18*b*, 18*c*, and directly connecting to the P-well 16. The P-well bias contact 26 may provide a current (e.g., fixed bias) to the P-well 16. Accordingly, the P-well 16 may be connected to positive/negative voltage to modulate the voltage Vt of the gate structure 24 (e.g., allowing biasing of a transistor in the isolated P-well 16). In this way, by providing a current using the P-well bias contact 26, it is possible to bias the P-well 16 at a value other than ground (GND). Also, it is now possible to provide a deep N-well biasing with a parasitic well diode to increase Vt in a PFET device, in addition to independently biasing the isolated P-well 16. It should again be recognized that the N-well 14 is devoid of any contacts (e.g., bias In embodiments, the P-well bias contact 26 may include back end of the line (BEOL) metal features, e.g., via contact and metal wiring layer(s), as is known in the art. The back end of the line features may be fabricated using conventional lithography, patterning and deposition methods. As should be understood by those of skill in the art, prior to forming the back end of the line features, a silicide contact may be provided on the P-well 16, under the P-well bias contact 26.

As should be understood by those of skill in the art, the silicide process begins with deposition of a thin transition metal layer, e.g., nickel, cobalt or titanium, over fully formed and patterned semiconductor material, e.g., a P-well 16. After deposition of the material, the structure is heated allowing the transition metal to react with exposed silicon (or other semiconductor material as described herein) in the active region of the semiconductor device (e.g., P-well 16) forming a low-resistance transition metal silicide. Following the reaction, any remaining transition metal is removed by chemical etching, leaving silicide contacts.

Figure 2:
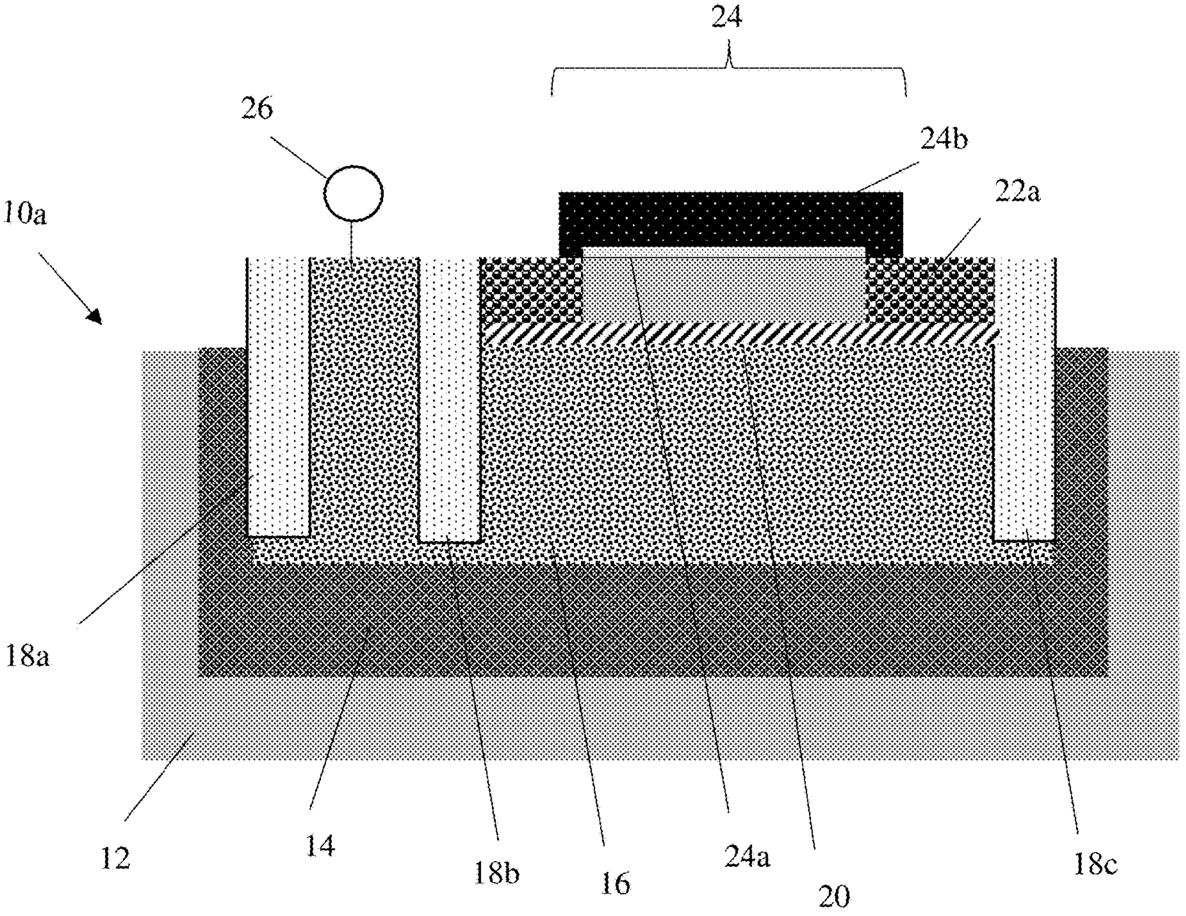
FIG. 2 shows a device with an isolated well and respective fabrication processes in accordance with additional aspects of the present disclosure.

FIG. 2 shows a structure and respective fabrication processes in accordance with aspects of the present disclosure. In particular, the structure 10*a* of FIG. 2 may be representative of a NFET device. In this representation, the semiconductor material 22*a* formed over the buried insulator layer 20 may be doped with a N+ dopant to form diffusion regions, e.g., source and drain region of the gate structure 24, for an NFET device. Also, in this representation, the P-well bias contact 26 is between the deep trench isolation structures 18*a*, 18*b*. The remaining features as similar to the structure 10 of FIG. 1.

As in the previous embodiment, the P-well bias contact 26 will provide a forward bias to the P-well 16 (and the deep N-well 14). Also, a reverse bias diode may form at a junction of the deep N-well 14 and the semiconductor substrate 12; whereas a forward bias diode may form at a junction of the deep N-well 14 and the P-well 16. As noted previously, the reverse bias diode will prevent a DC current path from the P-well 16 to the semiconductor substrate 12. On the other hand, the forward bias diode will provide a current path to the deep N-well 14. Also, in embodiments, the reverse bias diode and the forward bias diode may electrically isolate the deep N-well 14 and the P-well 16. By providing a current using the P-well bias contact 26, it is possible to bias the P-well 16 at a value other than ground (GND). In this way, it is possible to provide a deep N-well biasing with a parasitic well diode to decrease Vt in an NFET device, in addition to independently biasing the isolated P-well 16.

The structure can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a floating well of a first dopant type within a semiconductor substrate;

a second well of a second dopant type within the floating well of the first dopant type;

a reverse bias diode at a junction between the floating well and the semiconductor substrate;

a forward bias diode at a junction between the floating well and the second well;

a contact connecting to the second well; and deep trench isolation structures between the floating well and the second well, and within a body of the second well.

2. The structure of claim 1, wherein the floating well comprises a deep N-well and the second well comprises a P-well which is isolated from the semiconductor substrate.

3. The structure of claim 2, wherein the semiconductor substrate comprises a p-type substrate.

4. The structure of claim 1, wherein the reverse bias diode and the forward bias diode comprise back-to-back diodes.

5. The structure of claim 1, wherein the contact provides a fixed bias to the second well and forward biases the floating well to other than ground.

6. The structure of claim 1, further comprising a PFET above the second well.

7. The structure of claim 1, further comprising an NFET above the second well.

8. The structure of claim 1, wherein the floating well is devoid of any contacts.

9. A structure comprising:

a semiconductor substrate comprising a floating well of a first dopant type and a well of an opposite dopant type to the first dopant type;

a buried insulator layer above the semiconductor substrate;

a semiconductor on insulator material above the insulator buried layer, the semiconductor on insulator material comprising diffusion regions;

a gate structure on the semiconductor on insulator material between the diffusion regions;

a bias contact connecting to the well; and deep trench isolation structures between the floating well and the well, and within a body of the well.

10. The structure of claim 9, wherein the floating well is devoid of any bias contacts.

11. The structure of claim 9, wherein the floating well comprises a deep N-well, the well comprises a P-well and the semiconductor substrate comprises a p-type substrate.

12. The structure of claim 11, wherein the P-well is isolated within the N-well.

13. The structure of claim 9, further comprising back-to-back diodes at a junction between the floating well and the semiconductor substrate and the floating well and the well.

14. The structure of claim 12, wherein the back-to-back diodes comprise a reverse bias between the floating well and the semiconductor substrate and a forward bias diode between the floating well and the well.

15. The structure of claim 9, wherein the gate structure is part of an NFET.

16. The structure of claim 9, wherein the gate structure is part of a PFET.

17. A method comprising:

forming a floating well of a first dopant type within a semiconductor substrate;

forming a second well of a second dopant type within the floating well of the first dopant type;

forming a contact connecting to the second well; and forming deep trench isolation structures between the floating well and the second well, and within a body of the second well, wherein a first diode is formed at a junction between the floating well and the semiconductor substrate, and a second diode is formed at a junction between the floating well and the second well.

* * * * *